United States Patent [19]

Kaneno

[11] Patent Number: 5,173,913
[45] Date of Patent: Dec. 22, 1992

[54] SEMICONDUCTOR LASER
[75] Inventor: Nobuaki Kaneno, Itami, Japan
[73] Assignee: Mitsubishi Denki Kabushiki Kaisha, Tokyo, Japan
[21] Appl. No.: 719,036
[22] Filed: Jun. 21, 1991
[30] Foreign Application Priority Data Jun. 28, 1990 [JP] Japan .................................. 2-172406

[51] Int. Cl.$^5$ .............................................. H01S 3/19
[52] U.S. Cl. ........................................ 372/46; 372/45; 372/48
[58] Field of Search ............................. 372/45, 46, 48

[56] References Cited

U.S. PATENT DOCUMENTS

| | | | |
|---|---|---|---|
| 4,503,539 | 3/1985 | Mori et al. | 372/46 |
| 4,567,060 | 1/1986 | Hayakawa et al. | 427/87 |
| 4,630,279 | 12/1986 | Kajimura et al. | 372/45 |
| 4,792,960 | 12/1988 | Yamamoto et al. | 372/46 |
| 4,839,307 | 6/1989 | Imanaka et al. | 437/129 |
| 4,888,624 | 12/1989 | Johnston, Jr. et al. | 372/46 |

FOREIGN PATENT DOCUMENTS

| | | | |
|---|---|---|---|
| 0333418 | 9/1989 | European Pat. Off. | |
| 0131787 | 8/1983 | Japan | 372/46 |
| 0134488 | 8/1983 | Japan | 372/46 |
| 0007788 | 1/1985 | Japan | 372/46 |
| 0130882 | 7/1985 | Japan | 372/46 |
| 62-165989 | 7/1987 | Japan . | |
| 62-183586 | 8/1987 | Japan . | |
| 1-162393 | 6/1989 | Japan . | |
| 1-183183 | 7/1989 | Japan . | |

OTHER PUBLICATIONS

Okuda et al, "Highly Reliable InGaP/InGaAlP Visible Light Emitting Inner Stripe Laser With 667 nm Lasing Wavelength", IEEE Journal of Quantum Electronics, vol. 25, No. 6, Jun. 1989, pp. 1477-1482.

Horikawa et al, "Inner-Stripe AlGaAs/GaAs Laser Diode By Single-Step Molecular Beam Expitaxy", Electronics Letters, vol. 23, No. 5, Feb. 1987, pp. 209-210.

Yamamoto et al, "O 66 $\mu$m Room-Temperature Operation Of InGaAlP DH Laser Diodes Grown By MBE", Electronics Letters, vol. 19, No. 5, Mar. 1983, pp. 163-165.

Mori et al, "Single Mode Laser With a V-Shaped Active Layer Grown By Metalorganic Chemical Vapor Deposition: A V-Shaped Double Heterostructure Laesr", Journal of Applied Physcis, vol. 52, No. 9, Sep. 1991, pp. 5429-5433.

Primary Examiner—Georgia Y. Epps
Attorney, Agent, or Firm—Leydig, Voit & Mayer

[57] ABSTRACT

A semiconductor laser having a double heterojunction structure includes a first semiconductor cladding layer having a stripe-shaped groove, a semiconductor active layer disposed on the cladding layer and having an energy band gap narrower than that of the cladding layer, and a second semiconductor cladding layer disposed on the active layer and having an energy band gap wider than that of the active layer. The thickness of the active layer in the groove is larger than the thickness of the active layer outside the groove and the shape of the active layer has the shape of the groove. The thickness of the active layer is largest in the bottom of the groove and gradually becomes smaller toward the edges of the groove. The semiconductor laser can output a laser beam having nearly a circular cross-section at a low threshold current and is easily fabricated.

15 Claims, 8 Drawing Sheets

FIG.3(a) ACTIVE LAYER

SEMICONDUCTOR LASER

FIELD OF THE INVENTION

The present invention relates to a semiconductor laser, and more specifically relates to a semiconductor laser which emits a laser beam having nearly a circular cross-section, and is easily manufactured.

BACKGROUND OF THE INVENTION

Figure 8:
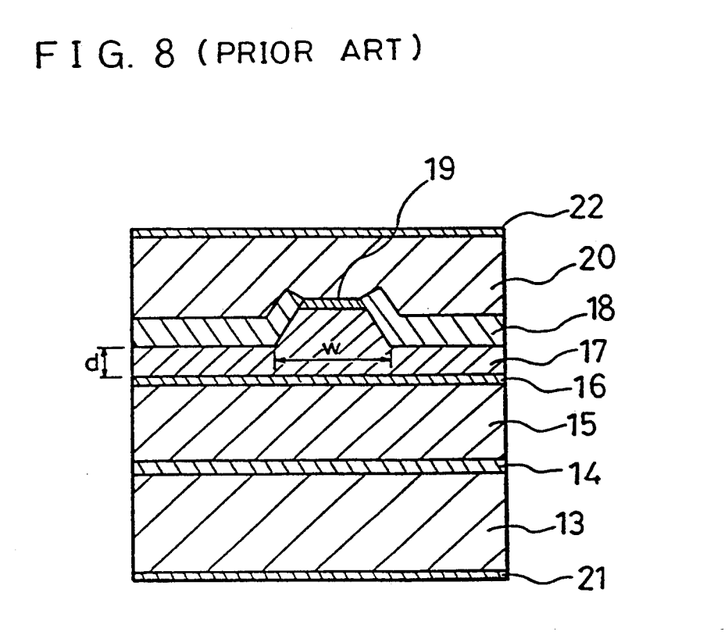
FIG. 8 is a cross-sectional view showing a prior art semiconductor laser.

FIG. 8 is a cross-sectional view showing a prior art semiconductor laser producing visible light, for example, as recited in "InGaAlP Transverse Stabilized Visible Laser Diodes Fabricated by MOCVD Selective Growth" by M. Ishikawa, Y. Ohba, Y. Watanabe, H. Nagasaka and H. Sugawara, Extended Abstracts of the 18th Conference on Solid State Devices and Materials, Tokyo, 1986, pp 153-156. In FIG. 8, numeral 13 designates an n type GaAs substrate. An n type GaAs layer 14 is deposited on the substrate 13, an n type AlInP lower cladding layer 15 is deposited on the n type GaAs layer 14, a GaInP active layer 16 is deposited on the lower cladding layer 15, and a p type AlInP upper cladding layer 17 including a stripe-shaped ridge is deposited on the active layer 16. A p type GaInP buffer layer 19 is deposited on the ridge part of the upper cladding layer 17, and an n type GaAs blocking layer 18 is deposited on regions other than the ridge part of the upper cladding layer 17 and on the side face of the ridge by means of selective growth. A p type GaAs contact layer 20 is deposited on the buffer layer 19 and on the blocking layer 18. A p side electrode 22 is deposited on the contact layer 20, and an n side electrode 21 is deposited on the rear surface of a substrate 1.

When a forward bias is applied to the pn junction between the n type GaAs substrate 13 and the contact layer 20, current is confined by the blocking layer 18, and is injected from the ridge into the active layer 16. These injected carriers ar confined in the active layer 16 by a hetero junction, and recombine to emit light. Furthermore, a difference in refractive index is produced in the horizontal direction of the active layer 16 by the light absorption and the current confinement by the blocking layer 18, and broadening of light in the lateral direction is limited. Light guided by such a waveguide causes laser oscillation in a Fabry-Perot resonator constituted by the end facets facing each other which are perpendicular to the direction of the length direction of the stripe-shaped ridge.

The prior art semiconductor laser is configured as described above, and therefore, to reduce leakage current and produce a difference in refractive index, it is required to perform etching so as to make a layer thickness d of the upper cladding layer 17 outside the ridge as thin as 0.2-0.3 micron. It is difficult to form the ridge with good reproducibility, and the laser characteristics are not uniform due to variations in the above-mentioned layer thickness d, resulting in a reduction in yield and poor reproducibility. Also, restricted by photolithography and etching, a ridge width W cannot be narrowed to about 1-2 microns, and therefore the laser light beam has a slender elliptic cross-section. Furthermore, the semiconductor laser shown in the conventional example has problems in that three separate crystal growth steps are required, processes in fabricating the laser are complicated and so on.

SUMMARY OF THE INVENTION

The present invention is directed to solving the above-described problems and has for its object to provide a semiconductor laser which has a low current threshold, can produce a laser beam whose cross-section is nearly a circle, and can be easily fabricated.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

In accordance with the present invention, a semiconductor laser having a double hetero structure comprises a first semiconductor cladding layer having a stripe-shaped V groove in the lengthwise direction of a resonator and an active layer formed on this cladding layer. The active layer on the above-mentioned V groove has a thickness larger than the thickness of the active layer outside the groove, and the active layer has a configuration on the groove that is a V shape in which the active layer thickness is largest at the groove bottom part, and gradually becomes smaller toward the groove edges.

Therefore, a semiconductor laser can be obtained which can form a narrow light emitting region 1-2 microns wide, emitting laser light having nearly a circular cross-section with good reproducibility, and manufactured by very easy processes.

DETAILED DESCRIPTION OF THE PREFERRED EMBODIMENTS

FIGS. 1(a) and 1(b) are a cross-sectional view and a perspective view showing structure of a semiconductor laser in accordance with an embodiment of the present invention, respectively.

In the figures, numeral 1a designates a p type GaAs substrate. An n type GaAs blocking layer 2a is grown on a (100) facet of the GaAs substrate 1a, and a stripe-shaped, forward-mesa-type groove is formed in the <011> direction by photolithography and etching so that the GaAs substrate 1a is exposed. A p type GaInP buffer layer 3 lattice-matching with GaAs is deposited on the blocking layer 2 and on the exposed substrate 1a in the forward-mesa-type groove. A p type AlGaInP lower cladding layer 4 lattice-matching with GaAs is deposited on the buffer layer 3, a GaInP active layer 5 lattice-matching with GaAs is deposited on the lower cladding layer 4, an n type AlGaInP upper cladding layer 6 lattice-matching with GaAs is deposited on the active layer 5, and an n type GaAs contact layer 7 is deposited on the upper cladding layer 6. A p side electrode 8 is deposited on the contact layer 7, and an n side electrode 9 is deposited on the rear surface of the substrate 1a. Numeral 23 and 24 designate resonator facets.

Next, description is made of a manufacturing process.

Figure 1:
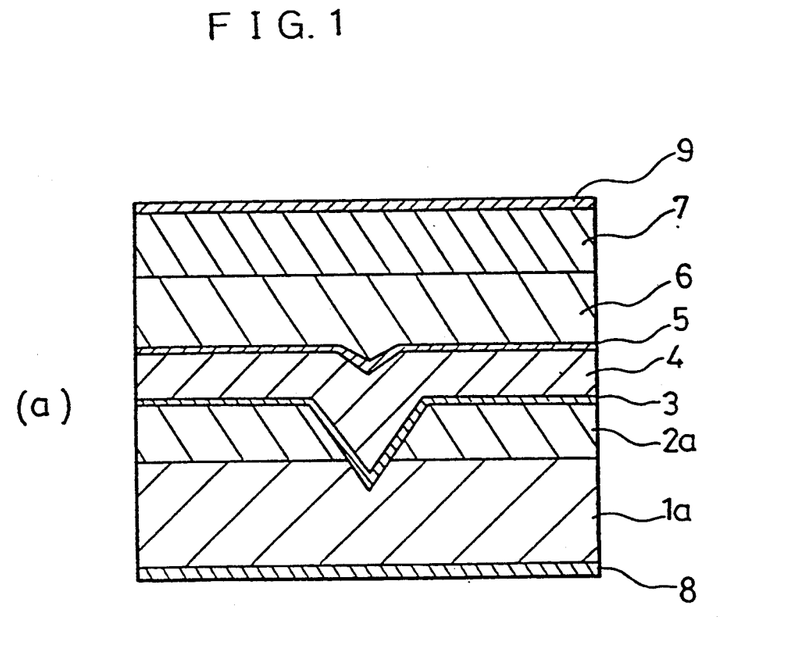
FIGS. 1(a) and 1(b) are a cross-sectional view and a perspective view showing a semiconductor laser in accordance with an embodiment of the present invention, respectively.

First, an n type GaAs current blocking layer is epitaxially grown on a (100) facet of the p type GaAs substrate 1a to a thickness of about 1 micron by the MOCVD (Metal Organic Chemical Vapor Deposition) method, and a stripe-shaped, forward-mesa-type groove is formed in the <011> direction by photolithography and etching so that the GaAs substrate 1a is exposed. It is enough that the shape of this groove is a forward-mesa-type and it is not necessarily required to be a V shape as shown in FIG. 1. The groove can be of a reversed trapezoidal shape such that a flat surface of the substrate 1a is exposed. On the wafer wherein the groove is formed in such manner, the p type $Ga_{0.5}In_{0.5}P$ buffer layer 3 of 0.1 micron or more in thickness, the p type $(Al_{0.7}Ga_{0.3})_{0.5}In_{0.5}P$ lower cladding layer 4 of about 0.5 micron in layer thickness, the $Ga_{0.5}In_{0.5}P$ active layer 5 whose thickness on the bottom part of the V-shaped groove of the lower cladding layer is about 0.06 micron, the n type $(Al_{0.7}Ga_{0.3})_{0.5}In_{0.5}P$ upper cladding layer 6 of about 1 micron in thickness, and the n type GaAs contact layer of about 1 micron in thickness are sequentially epitaxially grown by the MOCVD method. Lastly, the n side electrode is formed on the contact layer, and the p type electrode is formed on the rear surface of the substrate, and resonator facets 23, 24 are produced by cleavage, and thereby the device is completed.

Figure 2A:
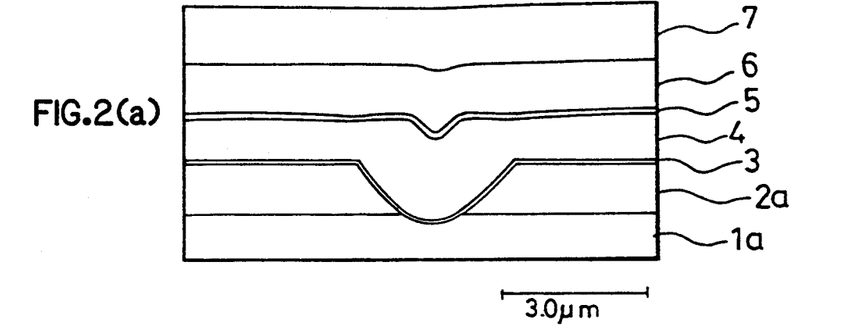
FIGS. 2(a) and 2(b) are taken from cross-sectional SEM photographs of the embodiment as shown in FIG. 1(a)
Figure 2B:
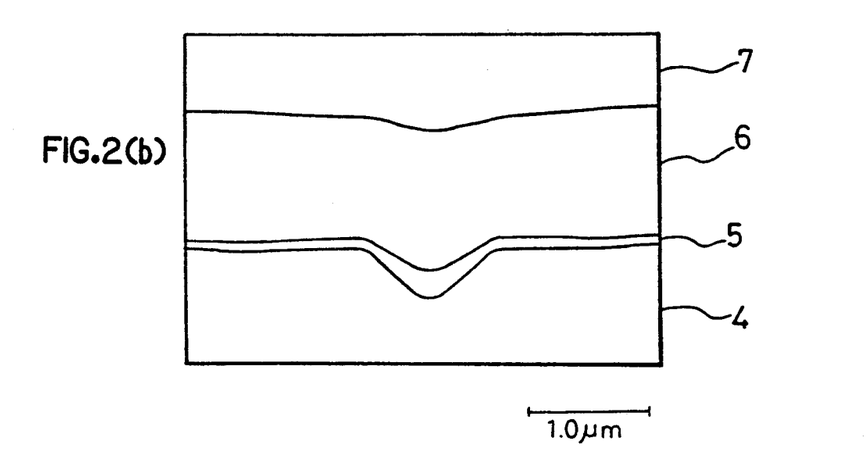

FIG. 2(a) is a view taken from a cross-sectional SEM (Scanning Electronic Microscope) photograph of the same structure as that of the embodiment as shown in FIG. 1, in which an n type GaAs blocking layer 2a is grown on a (100) facet of the p type GaAs substrate 1a, and layers from a p type GaInP buffer layer 3 through an n type GaAs contact layer 7 are grown on a wafer including a forward-mesa-type stripe-shaped groove in the <011> direction. FIG. 2(b) is a view taken from a cross-sectional SEM photograph in which the vicinity of the active layer 5 on the groove is further enlarged. Here, the structure shown in FIG. 2(a) is grown at a temperature of 670° C. and the V/III ratio is about 200. As shown in FIGS. 2(a) and 2(b), in the crystal growth of AlGaInP series by the MOCVD method, the growing speed inside of the groove is faster than that on the wafer flat part. Therefore, the layer thickness inside of the groove is larger than that outside of the groove. The growth is performed so that the layer thickness is largest at the groove bottom and becomes smaller toward the groove edges inside the groove. Furthermore, the growth of the lower cladding layer 3 is controlled so that the lower cladding layer 3 has a stripe-shaped V groove along the forward-mesa-type stripe-shaped groove produced in the blocking layer 2a and the active layer 5 is grown thereon as described above. Thereby the shape of the active layer can be produced to have a V-shape along the stripe-shaped V groove of the lower cladding layer 3.

Figure 3A:
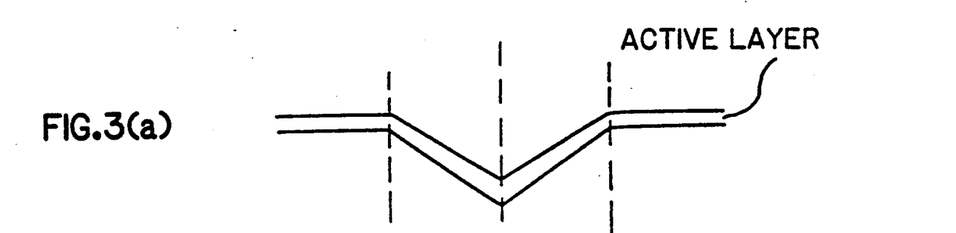
FIGS. 3(a)-3(d) is a composite graph for explaining advantages of the present invention.
Figure 3B:
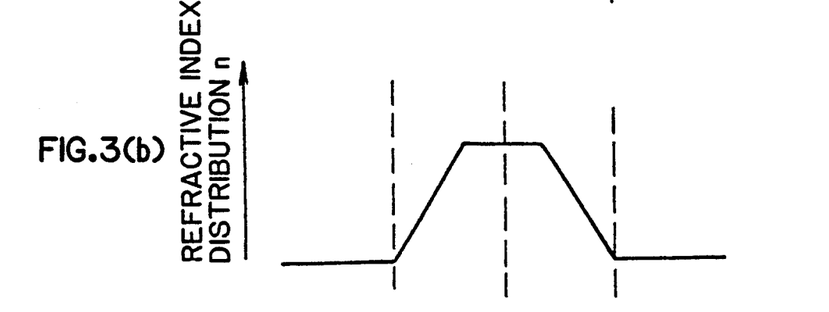
Figure 3C:
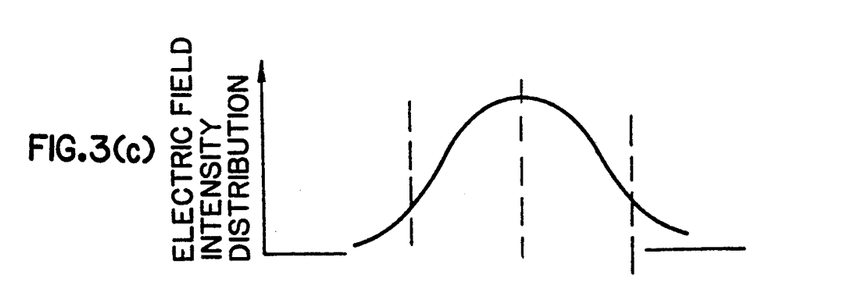
Figure 3D:
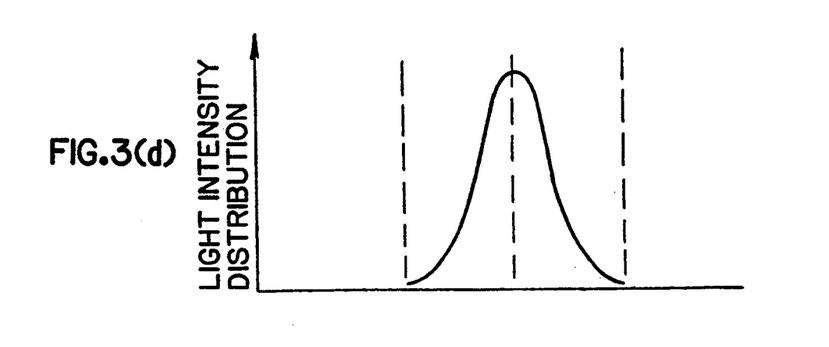

Then, by growing the upper cladding layer on this active layer, as shown in FIG. 3(a), a structure with the active layer sandwiched by the upper and lower cladding layers 4 and 6 inside the groove is built, and the refractive index distribution in the lateral direction is as shown in FIG. 3(b). Also, through the current confinement by the blocking layer 2a, an electric field intensity distribution which has a maximum at the groove bottom is formed as shown in FIG. 3(c). Furthermore, the thickness of the active layer at the groove bottom is larger than at the periphery of the groove. Therefore, the confinement of light is most intense at the groove bottom and a light intensity distribution as shown in FIG. 3(d) is formed, resulting in light concentration at the groove bottom. Accordingly, the narrow (1-2 microns) region of the groove bottom part becomes a laser light emitting region and a laser light beam having nearly a circular cross-section is obtained.

Figure 4A:
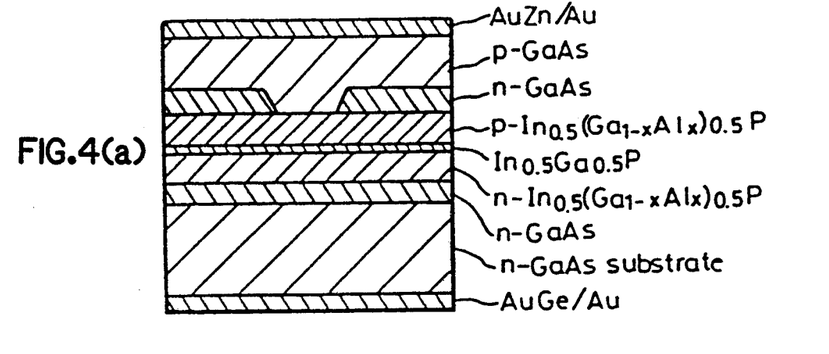
FIG. 4(a) is a cross-sectional view and FIGS. 4(b) and 5 are graphs for explaining relationships between the thickness of the active layer and the threshold current.
Figure 4B:
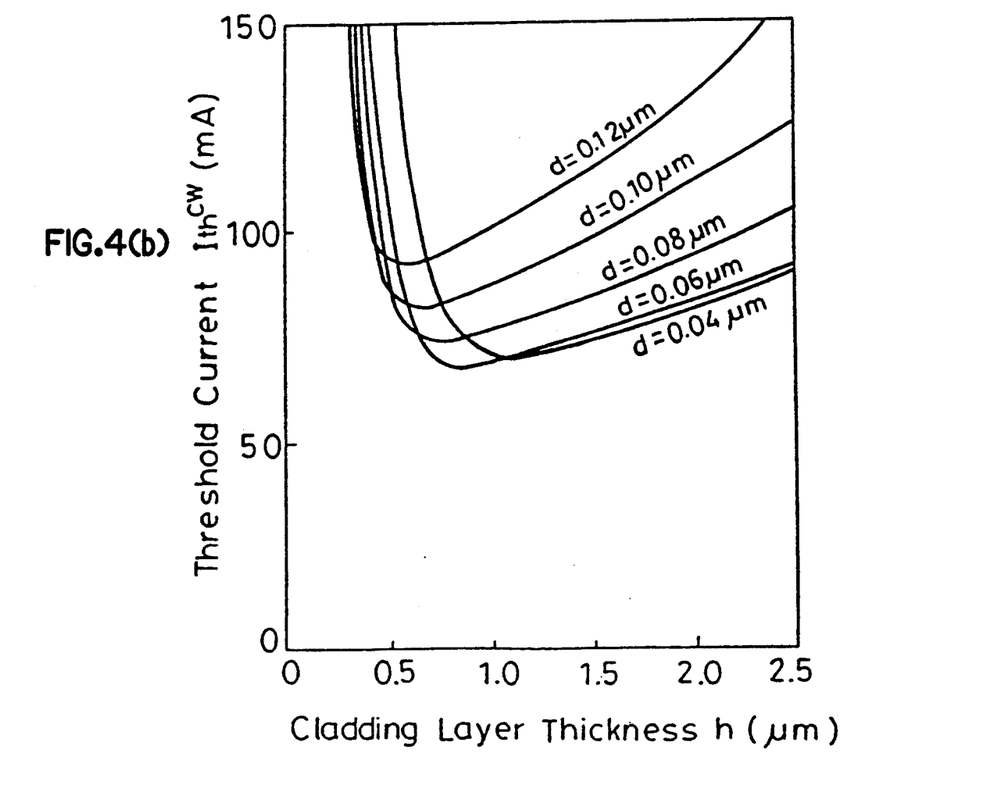
Figure 5:
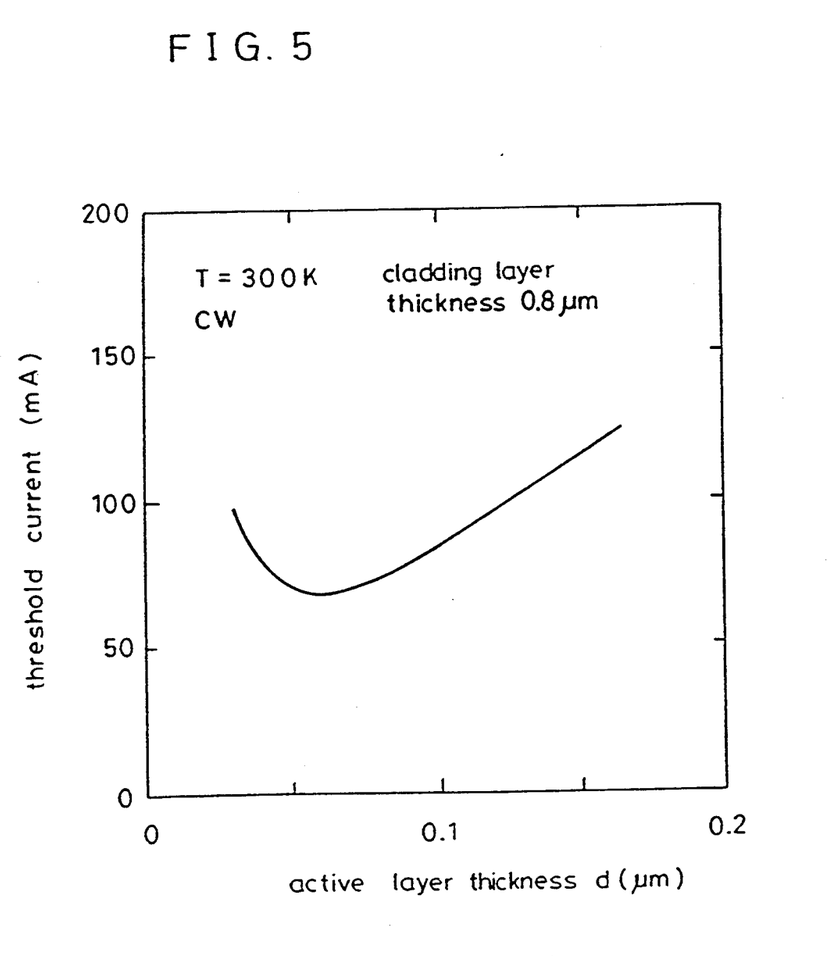

As recited in "Highly Reliable InGaP/InGaAlP Visible Light Emitting Inner Stripe Lasers with 667 nm Lasing Wavelength", by H. Okuda, et al., IEEE Journal of Quantum Electronics, Vol. 25, No. 1989, p 1477-1482, in a gain-guide-type laser as shown in FIG. 4(a), there is a relationship between the thickness of the cladding layer and the threshold current with the thickness of the active layer as a parameter as shown in FIG. 4(b). FIG. 5 shows the relationship between the thickness of the active layer and the threshold current where the cladding layer is 0.8 micron in thickness in FIG. 4(b). As is obvious from FIG. 5, the threshold current has a minimum at an active layer thickness of 0.06 micron, and when the thickness is smaller than 0.06 micron, the threshold current rapidly increases. Accordingly, when the thickness of the active layer in the groove bottom is controlled to be 0.06 micron, the thickness of the active layer becomes smaller toward the groove edges, and therefore the largest gain is obtained at the groove bottom part. Due to the above-described refractive index distribution and light intensity distribution, a light waveguide is formed in the groove bottom and, since the light emitting region is narrow, a laser light beam having nearly a circular cross-section is obtained, and a laser oscillation occurs at a low threshold value.

When a forward bias is applied to the pn junction, the current is confined by the blocking layer 2a, being injected from the groove part formed in a stripe into the active layer 5 on the groove. These injected carriers are confined in the active layer 5 by the hetero junction, and recombine and emit light. Here, as described above, the actual refractive index distribution is formed in the lateral direction of the active layer 5, and further the confinement of light in the active layer 5 located at the groove bottom is intense. Therefore, light concentrates in the groove bottom, being wave-guided along the direction of the stripe-shaped groove. The wave-guided light causes a laser oscillation in the Fabry-Perot resonator constituted of the end facets 23, 24 which are perpendicular to the length direction of the stripe and confront to each other.

Figure 6:
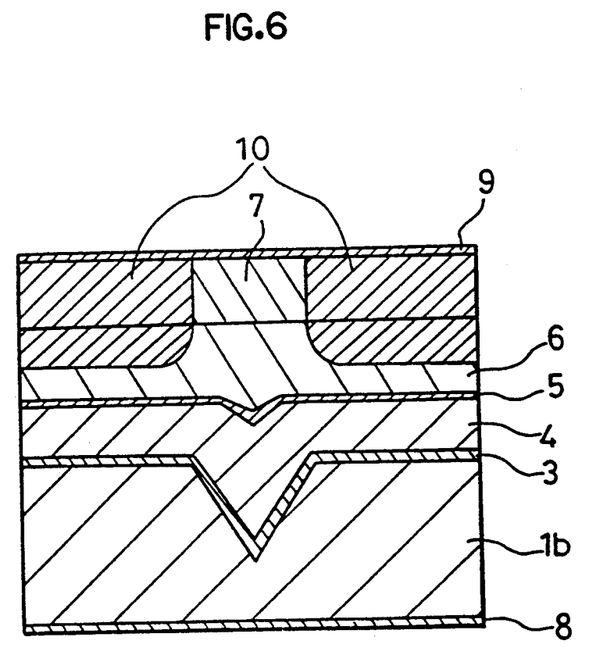
FIG. 6 and FIG. 7 are cross-sectional views showing other embodiments of the present invention.

In the above-mentioned embodiment, the n type GaAs blocking layer 2a is deposited on the p type GaAs substrate 1a, and the current is confined by forming the forward-mesa-shaped stripe groove, but the current confinement can be carried out as shown in FIG. 6. A p type GaInP buffer layer 3, a double heterojunction structure comprising a p type GaInP lower cladding layer 4, an active layer 5, and an n type AlGaInP upper cladding layer 6, and an n type GaAs contact layer 7 are successively formed on the p type GaAs substrate 1b on which the forward-mesa-shaped groove is formed, and regions 10 including Zn are produced in the contact layer 7 and the upper cladding layer 6 by diffusion or ion implantation. Current confinement is carried out by the regions 10.

Figure 7:
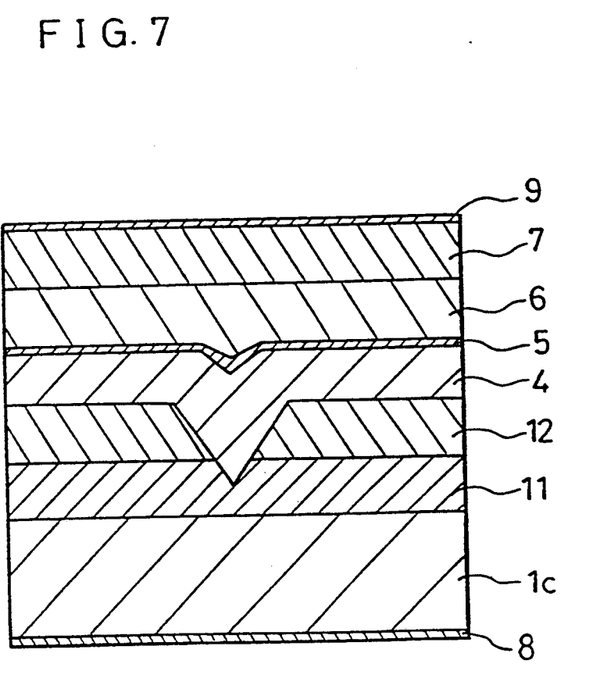

In the above-mentioned embodiment shown in FIG. 1(a), the blocking layer 2a is formed directly on the substrate and after forming the groove the p type buffer layer is formed, but it is also possible to form a p-type GaInP buffer layer 11 and an n type GaInP blocking layer 12 sequentially on the p type GaAs substrate 1c, and thereafter form the forward-mesa-type groove, as shown in FIG. 7.

As is evident from the foregoing description, according to the present invention, a semiconductor laser having a double hetero structure comprises a first semiconductor cladding layer having a stripe-shaped groove in the lengthwise direction of the resonator and an active layer formed on this cladding layer, wherein the thickness of the active layer on the groove is larger than that of the outside of the groove, and the active layer has a V-shaped configuration in the groove in which the thickness of the active layer is largest at the groove bottom, and gradually becomes smaller toward the groove edges. Therefore, a semiconductor laser that can output a laser beam having nearly a circular cross-section at a low threshold current and is easily fabricated is obtained.

What is claimed is:

1. In a semiconductor laser device, a structure comprising:
    a first conductivity type AlGaInP lower cladding layer including a stripe-shaped groove and having an energy band gap;
    an active layer of AlGaInP disposed on said lower cladding layer, both within and outside the groove, and having an energy band gap narrower than the energy band gap of said lower cladding layer wherein said active layer is thicker in the groove than outside the groove and is thickest within the groove at a bottom of the groove and tapers in thickness toward edges of the groove;
    a second conductivity type AlGaInP upper cladding layer disposed on said active layer and having an energy band gap wider than the energy band gap of said active layer; and
    first and second electrodes in electrical contact with the upper and lower cladding layers, respectively.

2. A structure in accordance with claim 1 wherein said active layer is formed on said lower cladding layer by metal organic chemical vapor deposition.

3. A structure device in accordance with claim 1 including a first conductivity type GaAs substrate, a second conductivity type GaAs current blocking layer disposed on said substrate wherein said lower cladding layer is disposed on said current blocking layer, and the groove extends into said substrate, said lower cladding layer having the shape of the groove.

4. A structure device in accordance with claim 3 including a first conductivity type buffer layer disposed between said current blocking layer and said lower cladding layer and between said substrate and said lower cladding layer in the groove.

5. A semiconductor laser comprising:
    a first conductivity type GaAs substrate;
    a second conductivity type GaAs current blocking layer disposed on said GaAs substrate including a stripe-shaped groove penetrating through said current blocking layer and extending into said substrate;
    a first conductivity type GaInP buffer layer lattice-matching with GaAs disposed on said current blocking layer and on said substrate in the groove;
    a first conductivity type AlGaInP lower cladding layer lattice-matching with GaAs disposed on said buffer layer and having the shape of the groove
    an active layer comprising AlGaInP lattice-matching with GaAs disposed on said lower cladding layer, wherein the thickness of said active layer in the groove is larger than the thickness of said active layer outside the groove, the active layer has the shape of the groove, and the thickness of the active layer is largest at a bottom of the groove and gradually becomes smaller toward edges of the groove;
    a second conductivity type AlGaInP upper cladding layer lattice-matching with GaAs disposed on said active layer;
    a second conductivity type GaAs contact layer disposed on said upper cladding layer; and
    first and second electrodes in electrical contact with said substrate and said contact layer, respectively.

6. A semiconductor layer in accordance with claim 5 wherein said blocking layer is disposed on a (100) facet of said substrate.

7. A semiconductor laser in accordance with claim 6 wherein the groove is disposed along the <011> direction of the substrate.

8. A semiconductor laser in accordance with claim 5 wherein said buffer layer, lower cladding layer, active layer, upper cladding layer, and contact layer are sequentially formed in a single crystal growth step by MOCVD.

9. A semiconductor laser comprising:
    a first conductivity type GaAs substrate;
    a first conductivity type GaInP buffer layer lattice-matching with GaAs disposed on said substrate;
    a second conductivity type GaAs current blocking layer disposed on said buffer layer including a V-shaped stripe groove penetrating through said current blocking layer and extending into said buffer layer;
    a first conductivity type AlGaInP buffer layer lattice-matching with GaAs disposed on said current blocking layer and on said buffer layer in the groove and having the shape of the groove;
    an active layer comprising AlGaInP lattice-matching with GaAs and disposed on said lower cladding layer, wherein the thickness of said active layer in the groove is large than the thickness of said active layer outside the groove and the thickness of the active layer is largest in a bottom of the groove and gradually becomes smaller toward edges of the groove;
    a second conductivity type AlGaInP upper cladding layer lattice-matching with GaAs disposed on said active layer;
    a second conductivity type GaAs contact layer disposed on said upper cladding layer; and
    first and second electrodes in electrical contact with said substrate and said contact layer, respectively.

10. A semiconductor laser in accordance with claim 9 wherein said buffer layer is disposed on a (100) facet of said substrate.

11. A semiconductor laser in accordance with claim 10 wherein the groove is disposed along the <011> direction of the substrate.

12. A semiconductor laser in accordance with claim 9 wherein said lower cladding layer, active layer, upper cladding layer, and contact layer are sequentially formed in a single crystal growth step by MOCVD.

13. A semiconductor laser comprising:
a first conductivity type GaAs substrate;
a first conductivity type GaInP buffer layer lattice-matching with GaAs disposed on said substrate including a stripe-shaped groove;
a first conductivity type AlGaInP lower cladding layer lattice-matching with GaAs disposed on said buffer layer having the shape of the groove;
an active layer comprising AlGaInP lattice-matching with GaAs disposed on said lower cladding layer, wherein the thickness of said active layer in the groove is larger than the thickness of said active layer outside the groove and the thickness of said active layer is largest at a bottom of the groove and gradually becomes smaller toward edges of the groove;
a second conductivity type AlGaInP upper cladding layer lattice-matching with GaAs disposed on said active layer;
a second conductivity type GaAs contact layer disposed on said upper cladding layer;
a first conductivity type region extending through said contact layer and into said upper cladding layer; and
first and second electrodes in electrical contact with said substrate and said contact layer, respectively.

14. A semiconductor laser in accordance with claim 13 wherein the groove is disposed on a (100) facet of said substrate along the <011> direction of said substrate.

15. A semiconductor laser in accordance with claim 13 wherein said buffer layer, lower cladding layer, active layer, upper cladding layer, and contact layer are sequentially formed in a single growth step by MOCVD.

* * * * *